Nov. 9, 1965 E. KOOI ETAL 3,216,871

METHOD OF MAKING SILICON ALLOY-DIFFUSED SEMICONDUCTOR DEVICE

Filed Oct. 17, 1961

INVENTOR
ELSE KOOI
AANT B.D.VAN DER MEER
BY
[signature]
AGENT

United States Patent Office 3,216,871
Patented Nov. 9, 1965

3,216,871

METHOD OF MAKING SILICON ALLOY-DIFFUSED SEMICONDUCTOR DEVICE

Else Kooi and Aant Bouwe Daniel van der Meer, both of Eindhoven, Netherlands, assignors to North American Philips Company, Inc., New York, N.Y., a corporation of Delaware Filed Oct. 17, 1961, Ser. No. 145,562
Claims priority, application Netherlands, Oct. 22, 1960, 257,150
17 Claims. (Cl. 148—178)

The invention relates to a method of producing a semiconductive blocking-layer system comprising a semiconductive body of silicon by means of an alloy-diffusion treatment by predominant diffusion of an acceptor impurity from an electrode-material melt formed on the silicon body and containing an active acceptor impurity and an active donor impurity, a p-type diffusion layer is formed in the adjacent silicon, on which, subsequent to cooling, in order of succession an n-type recrystallized silicon layer is deposited out of the melt due to the predominant segregation of the donor and an electrode-material residue to be used as a contact. The invention furthermore relates to the semiconductive blocking-layer system produced by carrying out the method according to the invention.

Such a method is employed inter alia for the manufacture of germanium transistors. In this case the electrode material to be fused is formed by carrier material such as lead or bismuth, to which is added a rapidly diffusing donr, for example arsenic, and an acceptor having a high segregation constant, for example gallium or aluminum in small quantities, for example, of a few percent by weight. After the alloy-diffusion treatment of a p-type germanium body with this electrode material a p-n-p structure is obtained, which is formed by the p-type recrystallized layer, the n-type diffusion layer and the remaining p-type portion of the body. By alloying an n-type emitter electrode and an ohmic base contact to the remaining p-type portion a Hook transistor can be manufactured from the structure thus obtained. In this form the alloy-diffusion technique has been found to be suitable also for the manufacture of p-n-p-germanium transistors, of which the electrode-material residue and the p-type crystallized layer constitute the emitter electrode, the diffusion zone constitutes the base zone and the remaining p-type portion of the body constitutes the collector zone. In order to provide the diffused base zone with a base contact, an n-type surface layer is diffused, prior to or during the alloy-diffusion treatment, into the p-type body surface adjacent the fusion area of the electrode material, the said surface layer adhering to the diffused base zone to be formed underneath the elctrode material, so that the base contact can be provided in a simple manner on this adhering surface layer.

It has been proposed to apply this alloy-diffusion technique also to the manufacture of silicon transistors. Whereas with germanium the donors are used as diffusing impurities and the acceptors as segregating impurities, the aceptors are used as diffusing impurities and the donors as segregating impurities with silicon, since the acceptors diffuse more rapidly into silicon than the donors. The method already proposed starts from an n-type silicon body, into which a p-type surface layer is previously diffused. The electrode material intended for the alloy-diffusion is fused locally onto this surface layer so that the penetration depth of the melt exceeds that of the pre-diffused layer. The electrode material consists mainly of gold or silver, to which are added small quantities of aluminum as a diffusing impurity and antimony as a segregating impurity. In order to avoid an excessive penetration depth of the electrode-material melt, it is necessary, when gold or silver is used as a carrier material, to employ only small quantities of this carrier material. Therefore, the electrode-material alloy is applied in a small quantity arranged on a molybdenum wire thickened at the end, by immersion or vaporisation; this process can be carried out, however, only with difficulty and yields hardly reproduceable results, so that in this way mass production of silicon transistors at low cost price is not obtained.

It has furthermore appeared that apart from the specific disadvantages of the method already proposed the alloy-diffusion treatment applied to silicon frequently yields unsatisfying results even with the use of alloy electrode materials with other combinations of a diffusing acceptor and a segregating donor and can be reproduced only with difficulty with respect to conductivity and conductivity type of the recrystallized and diffused layers. The results obtained often deviate largely from what could be expected on the basis of the diffusion rate and the segregation constant of the added quantities of acceptors and donors. There often occurs, for instance, an inadequate diffusion of the acceptor and an inadequate segregation of the donor and the results are, moreover, variable.

The object of the invention is, inter alia, to propose a simple measure for enhancing the reproduceability of the alloy-diffusion treatment, and to provide particularly suitable methods which, by applying the aforesaid measure, permit of carrying out mass production of silicon transistors at a low cost price.

In accordance with the invention with the method of the kind set forth in the preamble for the manufacture of a semiconductive blocking layer system with a semiconductive silicon body by means of an alloy-diffusison treatment, at least one of the impurities which are active during the alloy-diffusion is added to the electrode material substantially only after the electrode material is melted prior to the alloy-diffusion. At least one of the active impurities, for example the segregating donor or the diffusing acceptor or both, is preferably added not until a temperature of about 700° C. is reached or rather just before the diffusion temperature is attained.

When carrying out the measure according to the invention, i.e. the delay in the supply of at least one of the active impurities, the conditions of the alloy-diffusion treatment, for instance the course of the temperature during the treatment and the contents of active impurities are considerably less critical for obtaining satisfactory results, so that the reproducibility is enhanced. This favourable effect may be accounted for by the following explanation, on which the invention does not depend, however: In practice it has been found that the conditions of an alloy-diffusion treatment on silicon are such that the acceptor intended for diffusion, usually an element of the third column of the periodic system, hereinafter designated by $A_{III}$, and the donor intended for segregation, usually an element of the fifth column of the periodic system hereinafter denoted by $B_V$, may form compounds of the formula $A_{III}B_V$. This formation of $A_{III}B_V$ compounds, however, results in that part of the provided donor and acceptor quantities is no longer available for segregation or diffusion; the said part depends inter alia upon the chemical equilibrium in the formation of this compound at the instant of diffusion and segregation and therefore also upon the temperature variation during the treatment and upon the condition of the premanufactured electrode material and furthermore upon the quantities of the components taking part in the said reaction. With the conventional method already proposed, in which the two impurities are previously added to the electrode material and are already contained therein partly in the form of such a compound or in a form which is conducive to the formation of such a compound, the formation of such a compound may play an important part and reduce the possibility of attaining a reasonable degree of reproducibility. In addition, these compounds and the components may sometimes be highly reactive and may react to a troublesome extent during the heating process with the surrounding gases, for example, with small traces of water vapour or oxygen. On the contrary, with the method according to the invention, at least one of the impurities is added later, for instance a short time before the diffusion instant so that the possibility of the compound being formed, which, of course, requires some time particularly for the formation of nuclei, is reduced or that at least the formation of this compound is likely to be less harmful.

In order to further reduce the possibility of difficulties produced by the formation of $A_{III}B_V$ compounds, the supply of the active impurity is regulated, in accordance with a further, preferred embodiment of the invention, so that the concentration of the diffusion acceptor in the melt of the electrode material is lower than the concentration of the segregation donor. When carrying out the method according to the invention satisfactory results may, however, also be obtained, when the donor concentration is lower than the acceptor concentration, if a donor is suitably chosen of which the segregation constant exceeds that of the acceptor, since with the method according to the invention the formation of $A_{III}B_V$ compounds is not a disturbing factor or has at least no such disturbing effect as with the conventional method, particularly in the event of a rapid cooling after the treatment.

At least one of the active impurities is supplied preferably in the form of the vapour to the melt of the electrode material, for example by evaporating the impurity itself in the heating space or by evaporating it from an alloy or a compound of the impurity. The supply of an active impurity in the form of the vapour has a further advantage in that the transferred quantity of impurity can be accurately reproducible, i.e. by time- and temperature-control; this is particularly advantageous when the quantities to be transferred are small. In this manner the aforesaid, preferred choice of a smaller acceptor concentration than the donor concentration can be simply carried out. This method of transfer has furthermore the advantage that the impurity is supplied in its pure state to the melt of the electrode material. Although the transfer is preferably carried out in the form of the vapour, small quantities of impurity, for example in the form of a thin wire, may be introduced into the electrode material after melting.

The electrode material to be alloyed preferably consists mainly of tin. Apart from the active impurities the tin may contain non-disturbing quantities of an element, for example lead, which is otherwise substantially neutral. The use of tin as a carrier material has the great advantage that comparatively large electrode bodies may be used without involving an excessively great penetration depth, which is to be ascribed to the low solubility of silicon in tin even with the high temperatures of about 1000° C. to 1200° C. required for the alloy-diffusion. Moreover, tin is not evaporated to an appreciable extent at these high temperatures. It was, moreover, found that tin exerted a great attractive force on vaporous impurities, for example aluminum, which highly favours the transfer in the form of vapour. Although tin is to be preferred as a carrier material, other carrier materials may be employed, for example indium.

Particularly suitable diffusing acceptor impurities are the elements of the third column of the Periodic System, for example aluminum and gallium, and particularly suitable segregating donor impurities are the elements of the fifth column of the Periodic System, for example arsenic, antimony and phosphorus. For the alloy-diffusion treatment, of course, such an acceptor and such a donor are required to be chosen in such quantities that the diffusion of the acceptor and the segregation of the donor dominate, while preferably the donor concentration in the melt exceeds the acceptor concentration. It was found, for example, that with the use of tin as a carrier material, gallium as a diffusing impurity may be combined with arsenic or antimony as a segregating impurity and aluminum as a diffusing impurity with arsenic, antimony or phosphorus as a segregating impurity.

A preferred diffusing impurity is aluminum, since aluminum has a high diffusion rate, which exceeds that of gallium by a factor of 40 to 50 and since, in conjunction with other donor elements, it yields a particularly suitable pn-junction between the recrystallized layer and the diffusion layer. Aluminum is particularly suitable when tin is used as a carrier material. Moreover, aluminum was found to be introducible in a simple and efficacious manner in the form of vapour to a very accurately controllable concentration and in a very pure state into the molten electrode material.

Therefore, in a further embodiment of the alloy-diffusion treatment according to the invention, aluminum is preferred as a diffusing impurity, which is applied in the form of vapour to the electrode material mainly after the melting process prior to the alloy-diffusion treatment, by heating an aluminum-containing substance, preferably metallic aluminum at a temperature of at least 1000° C., preferably at a temperature lying approximately between 1050° C. and 1200° C. The transfer to the melt of the electrode material may be carried out in a conventional inert atmosphere or in vacuum. It is advantageous to use an oxygen-free atmosphere. The aluminum is preferably supplied to the melt of the electrode material in a nitrogen-containing atmosphere, for example in a mixture of $H_2$ and $N_2$, since it has been found that the transfer of vaporous aluminum from one electrode body to an adjacent electrode body is furthered by nitrogen and a variation in the nitrogen content of the ambience can be utilized in addition to control the transferred quantity of aluminum. It was found that gallium can be transferred in the form of vapour in a similar manner. The donor element may be included previously in the electrode material or it may be introduced in the form of vapour into the melt of the electrode material during the melting process. In conjunction with aluminum as a diffusing impurity, arsenic and phosphorous as segregating impurities have yielded particularly favourable results; of these two elements arsenic to be preferred.

Satisfactory results are also obtained by introducing first the acceptor impurity, for example aluminum, gallium or boron, into the electrode material and by adding the donor impurity preferably in the form of vapour to the melt of the electrode material after the latter has been melted prior to the alloy-diffusion process.

After the active impurity or impurities have been absorbed in suitable concentrations in the melt of the electrode material, this melt is further heated in order to carry out the alloy-diffusion in a conventional manner at a temperature lying between about 1050° C. and 1200° C. for the time required to attain the desired penetration depth of the diffusion layer, for example at 1100° C. for three minutes, after which upon cooling the n-type recrystallized layer separates out of the melt, on which layer the further electrode material solidifies.

The alloy-diffusion treatment according to the invention may start from a p-type silicon body and thus, for example, an n-p-n-drift transistor can be manufactured by alloying, after the alloy-diffusion treatment, onto the p-type body an n-type collector electrode and an ohmic base electrode. The remainder of the electrode material, from which the alloy-diffusion takes place, may be used, in conjunction with the recrystallized layer, as an emitter electrode, whereas the acceptor diffused provides the drift field in the base zone. In a similar manner n-p-s-n or n-p-i-n transistors can be manufactured by starting from a high-ohmic p-type or substantially intrinsic conductive silicon body. In the manner described above for germanium, by starting from an n-type silicon body, a silicon "Hook" transistor (n-p-n-p) can be manufactured in a simple manner.

However, the invention has been found to be particularly suitable for the manufacture of an n-p-n-silicon transistor structure, in which on an n-type silicon body is fused an electrode body to be used as the emitter electrode, while from the melt formed of the emitter electrode material, by diffusion of an acceptor, a p-type base zone is obtained in the body and upon cooling, by the segregation of a donor, an n-type recrystallized emitter zone and an emitter contact are separated out of the melt. The base electrode is arranged at the side of the emitter electrode on a p-type surface layer cohering to the base zone lying underneath the emitter electrode; this surface layer may for example be provided during the alloy-diffusion treatment in the surface adjacent the emitter electrode. However, it is preferred to diffuse into the n-type silicon body, prior to the alloy-diffusion treatment, a p-type surface layer and to carry out the alloy-diffusion treatment so that the penetration depth of the emitter electrode material melt is subsantially equal to or greater than the penetration depth of the pre-diffused surface layer. The pre-diffused surface layer ensures a low-ohmic connection with the base electrode to be provided simultaneously or afterwards and the greater penetration depth of the melt of the electrode material renders the thickness of the base zone independent of the preliminary treatment.

In the manufacture of an n-p-n transistor structure by the said method it is very advantageous to utilize the delayed supply of at least one of the active impurities according to the invention and the invention permits of carrying out in a simple manner the mass production of n-p-n silicon transistors.

In a particular embodiment of the method according to the invention, the silicon body has stuck to it, by heating side by side, an electrode body to be used as a base electrode and an electrode body to be used as an emitter electrode, both preferably mainly of tin, after which, subsequent to cooling, a quantity of acceptors is added to the electrode body forming the base electrode for example in the form of paste or a paint. Then, in order to carry out the alloy-diffusion treatment, the assembly is heated, so that part of the acceptor is transferred from the electrode body serving as a base electrode to the melt of the emitter electrode material, from where it constitutes the base zone by diffusion. To this end aluminum has been found to be particularly suitable as an acceptor. The transfer of the aluminum is preferably carried out in a nitrogen-containing atmosphere. In order to simplify the arrangement of the electrode bodies, for example by means of jigs, and in order to avoid mistaking one body for the other, the electrode bodies are preferably made of the same size and composition. The emitter electrode and the base electrode may, for example, be formed by pure tin pellets of the same size in which case the segregating donor, for example arsenic, as well as the aluminum can be added in the form of vapour during the alloy-diffusion process, to the melt of the emitter electrode material from a deposit of arsensic, for example an arsenic alloy provided in the heating space. However, it is preferred to provide the donor previously in the electrode material, in which case it is nevertheless very advantageous to start from a base electrode body and an emitter electrode body of equal size and composition. If after the arrangement of the bodies by adhesion, an adequate quantity of aluminum is provided on the base electrode body, an ohmic base electrode can yet be obtained on the base zone by overcompensation of the donor by the aluminum. The particular measure for arranging the acceptor on the base electrode body permits of providing an adequate quantity of acceptor and it is at the same time ensured that the quantity of this acceptor to be added to the melt of the emitter electrode material can be accurately dosed by control of the duration and the temperature of heating; this can be achieved only with greater difficulties in a different manner. In order to ensure a very low ohmic connection between the base electrode and the base zone, it has furthermore been found to be very advantageous to arrange, subsequent to the adhesion, not only the aluminum but also boron on the electrode body intended for the base electrode; this may again be achieved in a simple manner by using a paste.

If instead of supplying the acceptor impurity, as in the embodiment described above, the donor impurity is supplied afterwards, a suitable method of mass production of n-p-n-silicon transistors can also be obtained. In accordance with a preferred embodiment of such a method an electrode body intended as the base electrode and an electrode body intended for use as the emitter electrode are attached side by side to the silicon body, after which a quantity of boron is added to the electrode body to serve as a base electrode. Then the assembly is heated in order to carry out the alloy-diffusion treatment; during the heating process the donor is applied in the form of vapour. In this case particularly satisfying results have been obtained by using arsenic as a donor, which can be supplied in the form of vapour in a simple manner by providing an arsenic deposit, preferably an arsenic alloy, for example tin arsenic in the heating space, from which deposit the arsensic is evaporated automatically. The boron applied to the base electrode protects this electrode body to some extent from the donor vapour and is furthermore capable of overcompensating any residual quantity of donor in the base electrode body and of providing a satisfactory ohmic connection. The diffusing acceptor may, if desired, be provided in the electrode bodies prior to the adhesion. Use is preferably made of aluminum as an acceptor; in this case it is very advantageous to start from electrode bodies of the same carrier material, preferably tin, and the electrode bodies are attached by heating at a temperature exceeding about 1000° C., the aluminum being transferred in the form of vapour to the molten electrode bodies. In this case the presence of the aluminum in the base electrode body enhances the solubility of the boron. It is advantageous to use electrode bodies of the same size and composition.

In order to ensure a satisfactory absorption of the aluminum in the electrode bodies, it is very advantageous to adhere the electrode bodies provisionally to the silicon body by using an adhesive and to arrange the silicon body, during the heating process for the adhesion, with its side provided with the electrode bodies opposite a homogeneously distributed aluminum store or supply, for example a layer of aluminum powder or an aluminum foil. The adhesive permits of arranging the silicon body with the electrode bodies downwards above the aluminum deposit.

By means of the n-p-n transistor structure an n-p-n transistor can be made in a simple manner by providing the n-type collector zone with an ohmic n-type electrode. By this n-p-n-structure for example also an n-p-n-p-transistor can be made by providing the n-type collector zone with a rectifying p-type electrode. The particular embodiments described above may therefore be used not only for the manufacture of an n-p-n transistor but also with advantage for the manufacture of an n-p-n-p-transistor.

The method according to the invention and the particular, preferred measures thereof will now be described more fully with reference to two embodiments shown in diagrammatical figures and relating to the manufacture of an n-p-n silicon transistor.

*Example 1*

The process started from a rectangular n-type silicon slab having a resistivity of 2 ohm-cm. and a surface of about 1.4 x 1.4 $mms.^2$. The slab was first ground and then etched in an etching bath containing 4 parts by volume of 70% $HNO_3$ and 1 part by volume of 48% HF until a thickness of about 250$\mu$ and a clean, flat silicon surface was obtained.

Into the n-type slab is then diffused a thin p-type surface layer. To this end the slab was heated in a quartz tube at about 1200° C., a hydrogen flow containing water vapour being led through the tube after it had passed over a quantity of $Ga_2O_3$, heated at 950° C., the flow then containing gallium. The heating at about 1200° C. for about 30 minutes provided, as is shown in the sectional view of FIG. 1, an n-type silicon body with a p-type prediffused surface layer 2 of about 6$\mu$ in thickness. The surface layer 2 is covered by an extremely thin silica film 3. For the sake of clarity some dimensions are shown on an exaggerated scale in the figure.

Figure 2:
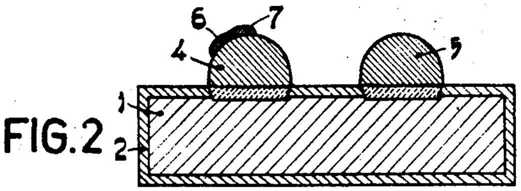

After the oxide film 3 has been removed by dipping in a 48% HF solution, an electrode body intended as a base electrode 4 and an electrode body 5 intended as an emitter electrode are arranged side by side on the surface layer, for example by means of an adhesive, for example neat's-foot oil. The two electrode bodies were of equal size and had a spherical shape of about 150$\mu$ in diameter; both were made from a tin alloy (99.5% by weight of Sn and 0.5% by weight of As). The donor arsenic has been provided in this case previously in the pellets. The two pellets were then heated for about 2 minutes in a quartz tube through which hydrogen was passed, the temperature being about 1030° C.; they were thus fused tight to the silicon body, so that a configuration as shown in FIG. 2 was obtained. The distance between the pellet 4 to serve as a base electrode and the pellet 5 to serve as an emitter electrode was about 60$\mu$. The melts of the pellets 4 and 5 penetrated through the surface layer 2 into the interior p-type portion 1. After cooling, a small quantity, for instance a 10$\mu$ thick layer, of a boron paste 6 on the basis of "Alkyd" resin and an aluminum paint 7, for instance a 20$\mu$ thick layer, were applied on the pellet 4 to serve as a base electrode by means of a brush or a needle.

Various compositions of aluminum powder or boron powder in binding agents can be used for the paste or paint. An example of a suitable aluminum paint consists of 12% aluminum powder, 80% of an 80% solution of an alkyd-resin in toluene and 8% butylcarbitol. As a further example a composition with a polymethacrylate base was used consisting of 15.5% aluminum powder, 36% of a 70% solution of polymethacrylate in xylene, 17% white spirit and 31.5% recinic oil. For the boron paste or paint the same binding agents were used, the amount of boron being about 20%. The amount of the boron and aluminum applied by way of the binding agent is not critical and can be varied in a wide range, provided that under the given circumstances sufficient boron and aluminum is applied for obtaining ohmic behaviour of the base electrode by the boron and sufficient aluminum for the diffusion.

The assembly was then heated at about 1070° C. in a quartz tube, through which a flow of 100 milliliter hydrogen per minute was passed; it was kept at this temperature for about five minutes, while in the meantime aluminum and boron dissolved in the melt of the base electrode material. Then nitrogen was added to the flow of gas, so that a mixed gas of 1 part by volume of $H_2$ and 3 parts by volume of $N_2$ was obtained. At the same time the temperature was raised slowly to about 1130° C. within about 15 minutes. During this time interval aluminum was transferred as a vapour from the pellet to serve as a base electrode to the melt of the emitter electrode material, the concentration being lower than the arsenic concentration already provided. The presence of nitrogen furthers the transfer of the aluminum to a considerable extent and without nitrogen a materially longer time would be required; this is probably due to the fact that the relatively heavy nitrogen atoms prevent the aluminum vapour from diffusing far away from the body. The supply of nitrogen permits, moreover, of controlling the aluminum transfer.

Figure 3:
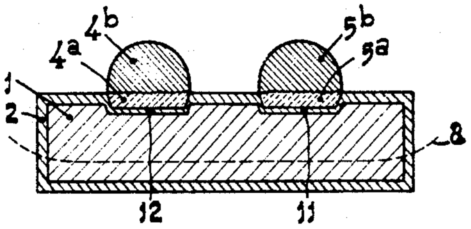

Thus one of the active impurities, i.e. aluminum, is supplied not until the emitter electrode material has been melted prior to the alloy diffusion process. After the temperature of 1130° C. was reached, the temperature was slowly reduced to 1120° C. within about 3 to 4 minutes, during which time the diffusion of the p-type base zone underneath the melt of the emitter electrode material and the melt of the base electrode material was performed. After this diffusion process, the assembly was further cooled to room temperature, while from the melt of the base electrode material a p-type recrystallized layer and the base contact were separated out by the segregation of aluminum and boron and from the melt of the emitter electrode material an n-type recrystallized layer and the emitter contact were separated out by the dominating segregation of arsenic. FIG. 3 shows the configuration thus obtained in a diagrammatical, sectional view. The parts 11 and 12 of the base zone diffused out of the said pellets are lying below the emitter electrode consisting of the segregated n-type emitter zone 5*a* and the emitter contact 5*b* and below the base electrode consisting of the recrystallized p-type layer 4*a* and the base contact 4*b*. The thickness of the base zone 11 below the emitter electrode (5*a*, 5*b*) amounts to about 2$\mu$. These parts 11 and 12 of the base zone cohere to the prediffused layer 2, which established a low-ohmic connection between the two electrodes. The remaining n-type part 1 of the initial body may be used as a collector zone. To this end the collector side of the body was first etched in an etching bath containing 1 part by volume of fuming $HNO_3$, 1 part by volume of HF and 1 part by volume of glacial acetic acid until the thickness of the slab was about 150$\mu$, which is indicated in FIG. 3 by the broken line 8.

Figure 4:
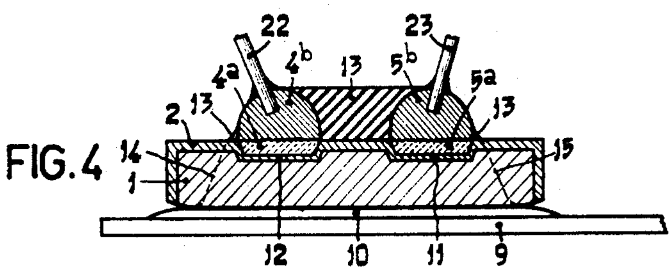

FIG. 4 shows diagrammatically how the collector zone 1 is alloyed onto an iron-nickel-cobalt (fernico) strip 9. To this end the fernico strip was previously coated with a 10$\mu$ AuSb-layer (0.3% by weight of Sb) by electrodeposition. This soldering layer 10 constitutes an ohmic connection between the fernico strip 9 and the n-type collector zone 1. Soldering was performed at a temperature of about 470° C. for about half a minute. To the base contact 4*b* and to the emitter contact 5*b* were then secured nickel supply wires 22 and 23 of a thickness of 50$\mu$.

Between the emitter contact 5*b* and the base contact 4*b* provision was made of a masking layer 13 of polythene, after which the transistor was sprayed with an etching liquid consisting of 1 part by volume of fuming $HNO_3$, 1 part by volume of 48% HF and 1 part by volume of glacial acetic acid for about 10 seconds and then rinsed in deionized water. Thus the part of the silicon body lying beyond the masking layer 13 was removed, which is indicated in FIG. 4 by the broken lines 14 and 15. The polythene layer 13 was then dissolved in boiling toluene and the transistor was slightly etched again in the last-mentioned etching agent and rinsed in deionized water. It was found by measuring that the current amplification factor $\alpha'$ was about 50 at a reverse voltage of 6 v. between the base contact and collector contact and at 1 ma. of emitter current, while the base resistance $R_{bb'}$ was about 70 ohms.

The method according to the invention described above and the preferred measurements involved permit of manufacturing simultaneously, if desired, large numbers of such n-p-n silicon transistors by arranging a number of sets of these electrode bodies side by side on a strip-shaped silicon body and by subjecting each of these sets simultaneously to the same process and by subdividing the strip subsequently into the separate transistors.

*Example 2*

Figure 1:
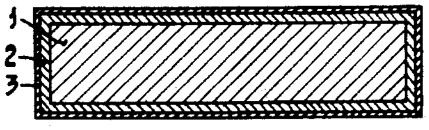
FIGS. 1 to 4 show diagrammatically in sectional views the blocking-layer silicon system in four successive stages of the manufacturing process according to the invention.
Figure 5:
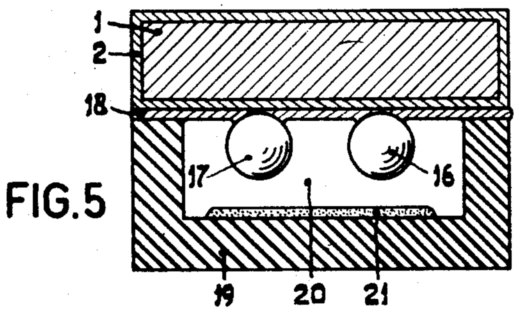
FIG. 5 is a diagrammatical, sectional view of the silicon body during one stage of a further preferred method according to the invention.

This example relates to the manufacture of an n-p-n silicon transistor by alloy-diffusion, in which the donor impurity is added only afterwards. The preliminary treatment of the silicon slab was performed in the same manner up to and inclusive of the stage in which the oxide film 3 was removed (FIG. 1). The only difference was in the choice of the p-type silicon slab of 0.6 ohm-cm. instead of 2 ohm-cm. After the oxide film was removed, the p-type surface layer had adhered to it side by side the electrode body to serve as a base electrode and the electrode body to serve as an emitter electrode by means of an adhesive in a provisional manner. The electrode bodies had the shape of pellets of the same size of about 150$\mu$ in diameter; both consisted of tin. The distance between the pellets was about 60$\mu$. As is illustrated in FIG. 5 in a diagrammatical, sectional view, the silicon slab 1 was arranged in a graphite jig 19 with the tin pellet 16 to serve as an emitter electrode and the tin pellet 17 to serve as a base electrode pointing downwards. The adhesive layer 18 held the pellets in place. In the graphite jig 19 provision was made of a recess 20 at the place of the pellets and a small quantity of aluminum powder 21 was provided in this recess 20. The distance of the aluminum powder from the silicon slab was about 2 mms.

The assembly was arranged in a quartz tube through which pure nitrogen was passed at the rate of about 100 mls. per minute and was heated at 1100° C. for about 2 minutes. During the heating process aluminum was transferred in vapour form into the two pellets and after cooling a configuration similar to that shown in FIG. 2 was obtained, in which the pellets 16 and 17 are fused tight to the silicon body. Then, with the aid of a needle, a small quantity of boron was applied to the pellet 17 to serve as a base electrode, the boron being provided as a paste on the basis of an alkyd resin.

The assembly was arranged in a quartz tube, through which pure hydrogen was passed, and it was heated, in order to perform the alloy-diffusion process, at 1160° C. During this heating process arsenic was supplied in the form of vapour as a donor to the electrode bodies. To this end a quantity of a tin-arsenic alloy (Sn 98% by weight, As2% by weight) was provided in the tube close to the silicon slab and during the heating arsenic was evaporated from this alloy and absorbed by the pellets. It was thus also ensured that one of the active impurities was added to the melt of the electrode material not until this material was melted prior to the alloy-diffusion. The heating at 1160° C. lasted for about 2 minutes; during this time interval a base zone of about 2$\mu$ was formed by the aluminum diffusion, below the melt of the emitter electrode material and below the melt of the base electrode material. Substantially identical results are obtained by cooling slowly, within 3 minutes, to 1140° C. or by carrying out the treatment so that after 1160° C. is reached, cooling is performed rapidly to 1140° C. and the heating is continued at 1140° for about 4 minutes. The small temperature reduction prior to or during the alloy-diffusion has the advantage that spreading of the pellets during the alloy-diffusion process is avoided. Finally cooling to room temperature was rapidly performed, during which the n-type recrystallized emitter zone and the emitter contact were separated out of the melt of the emitter electrode material and a p-type recrystallized zone and a base contact separated out of the melt of the base electrode material. The configuration thus obtained is substantially equal to that shown in FIG. 3. The transistor is otherwise treated and finished as is described in Example 1.

It was found by measuring that the base resistance $R_{bb'}$ of the transistor thus obtained was about 50 ohms and the current amplification factor $\alpha'$ was about 20 at $V_{bc}=6$ and $I_E=1$ ma.

The particular method according to the invention described above also permits of treating simultaneously and in the same manner a large number of sets of electrode bodies.

It should finally be noted that the invention is, of course, not restricted to the embodiments described above and that within the scope of the invention many variants are possible, for example by the omission of certain preferred measurements. For example in the method described in Example 1 the arsenic and the aluminum together may be added later as in the method described in Example 2 for the addition of arsenic, so that the manufacture can then start from pellets of pure tin. In this case it is furthermore possible to provide the arsenic previously in the electrode bodies and to supply arsenic in the form of vapour during the alloy-diffusion process. It is furthermore also possible to manufacture n-p-n-silicon transistors with one emitter electrode and, for example, two base electrodes by the same method.

What is claimed is:

1. In a method of manufacturing an alloy-diffused silicon semiconductor device, wherein a mass of electrode material is heated and melted in contact with a silicon portion of a semi-conductive body in the presence of an active diffusing acceptor impurity and an active segregating donor impurity which are provided in the melt, with the acceptor having a higher diffusion velocity in the silicon than the donor, and the acceptor is diffused into the body from the melt at a temperature exceeding 1000° C. forming underneath the mass a p-type diffused layer, but when the melt is cooled, the donor dominates forming adjacent the p-type diffused layer an n-type recrystallized layer on which is solidified the remaining electrode material as a contact thereto, in combination therewith the improvement comprising, before the acceptor is diffused into the body, adding at least one of the active acceptor and donor impurities to the electrode material melt substantially only after the latter has been melted.

2. A method as set forth in claim 1 wherein the said impurity is added to the melt only after it has attained a temperature of at least 700° C.

3. A method of manufacturing an alloy-diffused silicon semiconductor device, comprising heating and melting a mass of electrode material in contact with a silicon portion of a semiconductive body in the presence of aluminum as an acceptor impurity and an active segregating donor impurity which are provided in the melt, with the aluminum having a higher diffusion velocity in the silicon than the donor, at least one of the aluminum and donor impurities being added to the electrode material melt substantially only after the latter has been melted and prior to the diffusion of the aluminum, diffusing the aluminum into the body from the melt at a temperature exceeding 1050° C. forming underneath the mass a p-type diffused layer, and cooling the melt in which the donor dominates, forming adjacent the p-type diffused layer an n-type recrystallized layer on which is solidified the remaining electrode material as a contact thereto.

4. A method as set forth in claim 3 wherein it is the aluminum which is added in vapor form to the melt substantially only after it has melted, said aluminum being provided by heating an aluminum-containing substance at a temperature of at least 1000° C.

5. A method of manufacturing an n-p-n alloy-diffused silicon semiconductor device, comprising heating and melting a pair of adjacent masses of electrode material in contact with the same surface of a silicon semiconductive body and cooling same, thereafter adding a small quantity of an acceptor impurity to one of the masses and remelting the masses by heating at a temperature exceeding 1000° C. in the presence of an active segregating donor impurity which is provided in the melt of the other mass, with the acceptor having a higher diffusion velocity in the silicon than the donor, and vaporizing part of the acceptor on the said one mass and transferring same to the other mass only after the latter has melted and from whence it diffuses into the body from the melt forming underneath the said other mass a p-type diffused layer, cooling the melts whereby the said other mass wherein the donor dominates forms adjacent the p-type diffused layer an n-type recrystallized layer on which is solidified the remaining electrode material as a contact thereto, and whereby in the said one mass the acceptor dominates forming a p-type recrystallized layer in contact with the p-type diffused layer, and providing a base contact to the p-type recrystallized layer and an emitter contact to the n-type recrystallized layer.

6. A method as set forth in claim 5 wherein the electrode masses are mainly of tin.

7. A method as set forth in claim 6 wherein aluminum is the acceptor impurity, the donor impurity is initially provided in both electrode masses and the vaporization of the acceptor takes place in a nitrogen-containing atmosphere.

8. A method as set forth in claim 7 wherein boron is also added to the said one mass before its remelting.

9. A method of manufacturing an n-p-n alloy-diffused silicon semiconductor device, comprising heating and melding a pair of adjacent masses of electrode material in contact with the same surface of a silicon semiconductive body and cooling same, adding a small quantity of boron impurity to one of the masses and remelting the masses by heating at a temperature exceeding 1000° C. in a vapor atmosphere of an active segregating donor impurity which enters the melts only after they are melted and just prior to diffusion of an acceptor and in the presence of an active diffusing acceptor having a higher diffusion velocity in the silicon than the donor, and which enters the other mass from whence it diffuses into the body from the melt forming underneath the other mass a p-type diffused layer, cooling the melts whereby the said other mass wherein the donor dominates forms adjacent the p-type diffused layer an n-type recrystallized layer on which is solidified the remaining electrode material as a contact thereto, and whereby in the said one mass the boron and acceptor dominate forming a p-type recrystallized layer in contact with the p-type diffused layer, and providing a base contact to the p-type recrystallized layer and an emitter contact to the n-type recrystallized layer.

10. A method as set forth in claim 9 wherein the masses are of the same size and same initial composition.

11. A method as set forth in claim 9 wherein the masses are of tin, the active acceptor is aluminum, and the aluminum is provided in the masses via the vapor state during the initial melting treatment.

12. A method as set forth in claim 11 wherein the masses are first adhered to the body and then melted while located underneath the body above a layer of aluminum which is simultaneously vaporized by heating at a temperature exceeding 1000° C.

13. A method as claimed in claim 1 wherein the said impurity is added to the melt just before the diffusion treatment is carried out and after the melt has been heated at a temperature exceeding 1050° C.

14. A method as claimed in claim 1 wherein the concentration of the active acceptor impurity in the melt of the electrode material is controlled to be lower than the concentration of the active donor impurity.

15. A method as set forth in claim 2 wherein the electrode material is comprised mainly of tin.

16. A method as claimed in claim 4 wherein the supply of aluminum to the melt of the electrode material is carried out in a nitrogen-containing atomsphere.

17. A method as claimed in claim 4 where the donor is selected from the group consisting of arsenic and phosphorus.

References Cited by the Examiner

UNITED STATES PATENTS

| | | | |
|---|---|---|---|
| 2,840,497 | 6/58 | Longini | 148—1.5 |
| 2,938,819 | 5/60 | Genser | 148—1.5 |
| 2,974,072 | 3/61 | Genser | 148—1.5 |
| 3,001,895 | 9/61 | Schwartz et al. | 148—180 |
| 3,010,855 | 11/61 | Barson et al. | 148—1.5 |

OTHER REFERENCES

Jochems et al.: "Construction and Electrical Properties of a Germanium Alloy-Diffused Transistor," Proceedings of the IRE, June 1958, pp. 1161.

HYLAND BIZOT, *Primary Examiner.*

RAY K. WINDHAM, DAVID L. RECK, *Examiners.*